(12) United States Patent
Huang et al.

(10) Patent No.: US 6,423,175 B1
(45) Date of Patent: Jul. 23, 2002

(54) APPARATUS AND METHOD FOR REDUCING PARTICLE CONTAMINATION IN AN ETCHER

(75) Inventors: Yu Chih Huang, Taichung; Cherng Chang Tsuei, Taipei; I Chang Wu, Tainan, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/413,654

(22) Filed: Oct. 6, 1999

(51) Int. Cl.$^7$ .................................................. C23F 1/02

(52) U.S. Cl. ...................................................... 156/345

(58) Field of Search ........................... 438/712; 156/345

(56) References Cited

U.S. PATENT DOCUMENTS

| | | | | |
|---|---|---|---|---|
| 5,474,649 A | * | 12/1995 | Kava et al. ............... | 156/643.1 |
| 5,837,058 A | * | 11/1998 | Chen et al. ................. | 118/728 |
| 6,007,673 A | * | 12/1999 | Kugo et al. ................. | 156/345 |

FOREIGN PATENT DOCUMENTS

JP  09289194 A  * 11/1997  ....... H01L/21/3065

* cited by examiner

Primary Examiner—Benjamin L. Utech
Assistant Examiner—Matthew Anderson
(74) Attorney, Agent, or Firm—Randy W. Tung

(57) ABSTRACT

An apparatus and a method for reducing particle contamination by a polymeric film in a plasma etcher are described. In the apparatus for dry etching a wafer, a wafer holder and a ring member positioned juxtaposed to the holder are provided wherein the ring member is used to confine a plasma cloud generated in the chamber cavity onto an exposed surface of the wafer. The ring member has surface areas that is substantially exposed to the chamber interior, the surface areas are roughened to a depth between about 1 $\mu$m and about 10 $\mu$m between peaks and valleys formed in the roughened surfaces by either a sand-blasting method or by a chemical etching method. When the sand-blasting method is utilized to roughen the surface of the ring member, i.e., a focus ring in a reactive ion etching apparatus, particles having a mesh size between 200 mesh and 80 mesh may be suitably used. The roughened surfaces on the focus ring improve adhesion between a polymeric film necessarily produced during the plasma etching process for sidewall passivation and the surface of the quartz focus ring such that polymer film does not flake-off to form contaminants for the wafer positioned in the etch chamber.

11 Claims, 1 Drawing Sheet

APPARATUS AND METHOD FOR REDUCING PARTICLE CONTAMINATION IN AN ETCHER

FIELD OF THE INVENTION

The present invention generally relates to an apparatus and a method for reducing particle contamination in an etcher that utilizes a ring member positioned juxtaposed to a wafer holder and more particularly, relates to an apparatus and a method for reducing particle contamination from a polymeric film adhered to a focus ring used in a reactive ion etching apparatus.

BACKGROUND OF THE INVENTION

In the fabrication of semiconductor devices, particularly in the fabrication of submicron scale semiconductor devices, profiles obtained in etching processes are very important. A careful control of the surface etch processes is therefore necessary to ensure directional etching. In conducting an etching process, when an etch rate is considerable larger in one direction than in the other directions, the process is called anisotropic. A reactive ion etching (RIE) process assisted by plasma is frequently used in anisotropic etching of various material layers on top of a semiconductor substrate.

The plasma generated in a RIE process consists of neutrons, ions and electrons. The effect of each species on the etch results and their possible interactions with each other are not well understood. An etch process and the resulting etch products can be analyzed by mass spectrometry, while the chemical compositions on the surfaces can be detected by an in-situ or ex-situ x-ray photoelectron spectrometer, Auger spectroscopy and secondary ion mass spectrometry. In plasma enhanced etching processes, the etch rate of a semiconductor material is frequently higher than the sum of the individual etch rates for ion sputtering and neutral etching due to a synergy in which chemical etching is enhanced by ion bombardment.

In an anisotropic etching process, it is clear that the ions striking the surface must themselves be anisotropic, i.e., the ions travel mainly in a direction perpendicular to the wafer surface. The ions are normally oriented and accelerated in a sheath. Proposed mechanisms for anisotropic plasma etching are that first, perpendicular ion bombardment creates a damaged surface that is more reactive toward neutral etchants, and second, ions help to desorb etch-inhibiting species such as etch products from the surface. In either one of the mechanisms, the ion path must be perpendicular to the wafer surface such that only the etch rate of the bottom surface is enhanced. Ideally, the ions should not bombard the sidewalls at all.

In an actual plasma etching process, ion-neutral particle collisions from the plasma sheath result in a fraction of the ions bombarding the sidewalls. As a result, lateral etching of the sidewalls occurs to some extent. Theoretically, the number of ion-neutral collisions in the sheath is directly proportional to the sheath thickness and inversely proportional to the ion mean free path. Since the ion mean free path is usually proportional to the chamber pressure, reducing the pressure results in reduced ion-neutral collisions and therefore enhances anisotropic etching. Since ions desorb etch-inhibiting species (such as etch products) from the etch surface, the formation of sidewall films (i.e., a passivation layer) during the etching process plays an important role in the development of the anisotropic etch profile. The passivation film protects the sidewalls from etching by non-perpendicular incoming ions.

In an anisotropic etching process, the etch directional control can be enhanced by a mechanism known as sidewall passivation. By adjusting the etchant gas composition and the reactor parameters, an etch-inhibiting film can be formed on the vertical sidewalls. The etch-inhibiting film (or passivation film) slows down or completely stops lateral attack while the etching of horizontal surfaces (i.e., a bottom surface) proceeds. For instance, in an etch process for silicon, when $O_2$ is added to a $Cl_2$ plasma, an oxide film can be grown on the sidewalls that are not exposed to ion bombardment. Similarly, in a fluorocarbon plasma etching process, a greater elemental ratio of carbon to fluorine can be used to deposit involatile polymer films on the sidewalls thus forming a coating that blocks chemical attack. While polymer film may also deposit on the horizontal surfaces, it is readily removed by the ion bombardment and therefore allowing etching of such surfaces to continue.

The sidewall passivation effect is also observed when an insulating layer such as a photoresist layer deposited on top of a semiconductor substrate is bombarded by plasma ions. On top of the photoresist layer, charge built up occurs during the reactive ion etching process by the severe ion bombardment on the substrate surface. These stored charges can cause a distortion in the ion path bombarded toward the substrate surface. When positive charge accumulates on the wafer surface as a result of impinging ions and emitted secondary electrons, the photoresist surface may be charged up high enough to produce a current flowing through the photoresist layer causing its degradation or other permanent damages. The charge accumulation also causes a distortion in the path of the ion beam by stripping the space-charge compensating electrons from the ion beam. Such charge accumulation further distorts the ion beam path and causes them to collide with the sidewalls of the device.

In a plasma bombardment process conducted on a semiconductor structure covered by a photoresist layer, the plasma ions excited by the bias voltage etch away difficult-to-etch residue materials from the semiconductor substrate, while simultaneously etches a fraction of the photoresist material from the photoresist layer to perform sidewall passivation in order to enhance the anisotropic etching process. In the process where the photoresist material is etched away from the top of the substrate, two steps are normally involved. In the first step, the photoresist material is etched away and separated from the photoresist layer and deposited on the top portion of the sidewalls. The deposited photoresist material is then bombarded again by the plasma ions and sputters to the lower portion of the sidewalls. Since photoresist layer normally consists of a polymeric material and that when it decomposes in plasma, fragments of the polymeric material combine with some of the gas elements in the plasma to form a passivation material for depositing on the sidewalls.

When a plasma etching process on the surface of a silicon wafer is conducted, for instance, in a process for forming a STI (shallow trench isolation) in a polysilicon layer that is defined by a photoresist on top, the polymeric material generated during the etching process not only deposits on the sidewalls of the shallow trench as it is supposed to, but also deposits on other areas inside the etch chamber other than the wafer surface. For instance, the polymeric material may form a thin film on the chamber wall and on a focus ring that is normally positioned juxtaposed to the wafer pedestal for confining a plasma cloud to the wafer surface. After repeated etching process on numerous wafers is conducted in the same etch chamber, the polymeric film deposited on the various components in the etch chamber may be cumulated to a significant thickness and as a result, the probability of the film peeling off from the surface it attached to becomes significantly higher. When such peeling of the polymeric film occurs, a serious contamination problem resulted when the film falls on the wafer surface.

In the plasma etch chamber, while certain components including the chamber wall stays stationary during the etching and the wafer loading/unloading process, certain other components move up and down with the wafer pedestal during the wafer loading/unloading process. One of such components that moves with the wafer pedestal is a focus ring which is made of a quartz material to endure the highly corrosive environment of the etching plasma. The focus ring is a circular ring member that is positioned just above the wafer pedestal and the wafer, serving the function of confining a plasma cloud to the exposed surface of the wafer. Since the focus ring is placed in close proximity to the wafer surface and to the plasma could, it is also the most likely place where polymeric film deposit occurs. During the up and down movement of the focus ring with the wafer pedestal, the deposited polymeric film flakes off the surface of the focus ring and becomes a serious contamination source. Since the formation of the polymeric material is desirable for the plasma etching process, i.e., in order to achieve the desirable anisotropic etching, the deposition of the polymeric material on the focus ring cannot be avoided. It is therefore necessary to provide a method for preventing the polymeric film layer deposited on the focus ring from flaking-off and becoming a contamination source to a wafer.

It is therefore an object of the present invention to provide an apparatus and a method for reducing particle contamination in a plasma etcher that do not have the drawbacks or shortcomings of the conventional apparatus and method.

It is another object of the present invention to provide an apparatus for reducing particle contamination in a plasma etcher wherein the formation of a polymeric film during the etching process as a contamination source can not be avoided.

It is a further object of the present invention to provide an apparatus for reducing particle contamination in a plasma etcher wherein the formation of a polymeric film for sidewall passivation is necessary and the deposition of the polymeric material on chamber components is inevitable.

It is another further object of the present invention to provide an apparatus for reducing particle contamination in a plasma etcher wherein the deposition of a polymeric film on a moving chamber component of a focus ring is inevitable.

It is still another object of the present invention to provide an apparatus for reducing particle contamination in a plasma etcher by providing a focus ring which is fabricated of a quartz material with a roughened surface for improving adhesion of a polymeric film thereto.

It is yet another object of the present invention to provide an apparatus for reducing particle contamination in a plasma etcher wherein a focus ring is provided with a roughened surface such that the adhesion of a deposited polymeric film thereon is improved for preventing flaking of the film as a contamination source.

It is still another further object of the present invention to provide a method for dry etching a wafer without contamination problem by using a focus ring with a roughened surface which has a depth between peaks and valleys in the surface between about 1 $\mu$m and about 10 $\mu$m.

It is yet another further object of the present invention to provide a dry etching apparatus for etching a wafer wherein a focus ring is provided with a roughened surface that has depth between about 1 $\mu$m and about 10 $\mu$m between peaks and valleys formed in the roughened surface for achieving improved adhesion with a polymeric film and for preventing the flaking-off of the film.

SUMMARY OF THE INVENTION

In accordance with the present invention, an apparatus and a method for reducing particle contamination in a plasma etcher is provided.

In a preferred embodiment, a dry etching apparatus for a wafer that has reduced particle contamination characteristics is provided which includes a wafer holder for holding a wafer inside a chamber cavity and a ring member positioned juxtaposed to the wafer holder, the ring member has surfaces substantially exposed to the chamber interior, the surfaces is roughened to a depth of between about 1 $\mu$m and about 10 $\mu$m between peaks and valleys formed in the roughened surface.

In the dry etching apparatus for a wafer that has reduced particle contamination characteristics, the ring member may be fabricated of a high temperature insulative material, or of a ceramic material, or of a quartz. The ring member may be a focus ring for a reactive ion etcher. The roughened surface may have a depth preferably between about 3 $\mu$m and about 5 $\mu$m between peaks and valleys formed in the surface. The roughened surface may be formed by sand-blasting with particles of 80 mesh or smaller, or with particles between 200 mesh and 80 mesh. The ring member confines a plasma cloud generated in the chamber cavity onto an exposed surface of the wafer.

The present invention is further directed to a method for dry etching a wafer without polymer contamination problem which can be carried out by the operating steps of providing an etch chamber that is equipped with a wafer holder therein, providing a ring member for positioning juxtaposed to the wafer holder when a wafer is positioned thereon, roughening surfaces on the ring member until a depth between peaks and valleys in the surfaces between about 1 $\mu$m and about 10 $\mu$m is obtained, and igniting a plasma in the etch chamber to etch the wafer.

The method for dry etching a wafer without polymer contamination problem may further include the step of roughening surfaces on the ring member until a depth between peaks and valleys in the surfaces preferably between about 3 $\mu$m and about 5 $\mu$m is obtained. The method may further include the step of roughening surfaces on the ring member by sand-blasting with particles of 80 mesh or smaller, or by sand-blasting with particles between 200 mesh and 80 mesh. The method may further include the step of providing the ring member in a quartz material, or providing the ring member for use as a focus ring in a reactive ion etcher. The method may further include the step of positioning the ring member over and juxtaposed to the wafer such that plasma generated in the etch chamber is confined to an exposed surface of the wafer. The method may further include the step of adhering a polymer material generated by the plasma to the roughened surfaces of the ring member such that it does not fall off the roughened surfaces to become contaminant.

In another preferred embodiment, a dry etching apparatus for etching a wafer is provided which includes a wafer holder for holding a wafer inside a chamber cavity, a ring member for positioning juxtaposed to the wafer holder for confining a plasma generated in the chamber cavity onto an exposed surface of the wafer, the ring member has surfaces substantially exposed to the chamber interior, the surfaces being roughened to a depth of between about 1 μm and about 10 μm between peaks and valleys formed in the roughened surfaces for achieving improved adhesion with a polymeric film deposited thereon and for reducing flaking-off of the film as a contaminant onto a wafer positioned on the wafer holder, and a plasma source for generating a plasma in the chamber cavity.

In the dry etching apparatus for etching a wafer, the surfaces are preferably roughened to a depth of between about 3 μm and about 5 μm between peaks and valleys formed in the roughened surfaces. The ring member may be a focused ring made of quartz for use in a reactive ion etcher.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a dry etching apparatus for a wafer that has reduced particle contamination characteristics and a method for preparing such apparatus.

The dry etching apparatus is provided with a wafer holder inside a chamber cavity and a ring member that is positioned over and juxtaposed to the wafer holder for confining a plasma cloud generated in the chamber cavity onto an exposed surface of the wafer. The ring member has surfaces that are substantially exposed to the chamber interior and roughened to a depth of between about 1 μm and about 10 μm as measured between peaks and valleys formed in the roughened surfaces. The roughened surfaces of the ring member improve adhesion between the ring member and a polymeric film deposited thereon such that flaking-off of the film as contaminants for the wafer can be significantly reduced or eliminated.

The ring member utilized in the dry etching apparatus may be a focus ring that is frequently used in a reactive ion etching apparatus wherein the ring is fabricated of a quartz material. The surface roughness on the quartz surface can be suitably provided by a chemical etching method or by a mechanical sand-blasting method. When the sand-blasting method is utilized, particles between 200 mesh and 80 mesh may be used to generate a roughened surface that has a depth between about 1 μm and about 10 μm between peaks and valleys formed in the surface of the quartz. A more preferred range of the surface roughness is between about 3 μm and about 5 μm as a depth between the peaks and valleys formed in the surface of the quartz.

The present invention further provides a method for dry etching a wafer substantially without the polymer contamination problem which can be carried out by utilizing an etch chamber equipped with a wafer holder and a ring member positioned juxtaposed thereto. The method further includes the step of roughening the surface of the ring member, or the surface of a focus ring used in a reactive ion etching apparatus, until a depth between peaks and valleys in the surface between about 1 μm and about 10 μm is achieved. The method can then be completed by igniting a plasma in the etch chamber for etching a wafer.

Figure 1A:
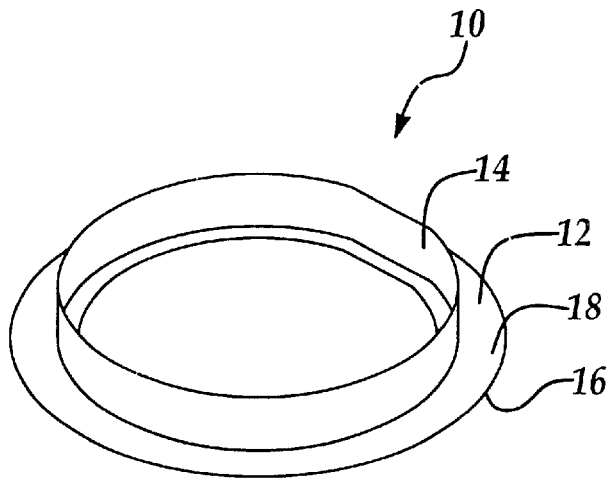
FIG. 1A is a perspective view of the present invention quartz ring that has roughened surfaces made by a sand-blasting process.

Referring initially to FIG. 1A, wherein a perspective view of a present invention ring member, or a focus ring 10 is shown. The focus ring 10 is generally constructed by a flat base portion 12 and a perpendicular collar portion 14 that are integrally joined together. The function of the focus ring is to confine the plasma cloud generated in the etch chamber cavity such that it is concentrated to the exposed surface of the wafer that is positioned on a wafer holder. The focus ring, in order to withstand a highly corrosive environment of the etching plasma, is normally fabricated of a high density ceramic material such as quartz.

Figure 1B:
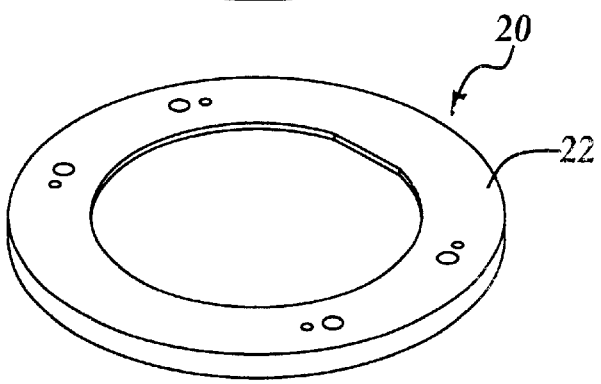
FIG. 1B is a perspective view of a quartz cover ring which is mounted under the focus ring.

Under the focus ring 10, is positioned a quartz cover ring 20 as shown in FIG. 1B. The quartz cover ring stays stationarily under the focus ring and its top surface 22 is completely covered by the bottom surface 16 of the flat base portion 12 of the focus ring 10. The quartz cover ring 20 therefore does not have a polymeric film deposition problem since it is shielded by the focus ring 10. The focus ring 10 and the quartz cover ring 20 move up and down with the wafer pedestal 30, shown in FIG. 1C, or an electrostatic chuck inside the chamber cavity 40. A wafer loading/unloading port 32 is provided for loading and unloading of wafers from the pedestal 30 through a wafer port 34. The electrostatic chuck 30 holds a wafer (not shown) by an electrostatic force and therefore no clamping device such as a clamping ring is required.

During the etching of a wafer surface, such as that used for etching a shallow trench isolation in a polysilicon layer defined by a photoresist on top, a polymeric material is produced in the etching plasma and thus polymer deposits on the surfaces of the focus ring 10. The deposition of the polymeric material on the focus ring 10 frequently occurs on the top surface 18, on the flat base portion 12, and on the inside and outside surfaces of the perpendicular collar portion 14. After prolong use of the etch chamber for etching a large number of wafers, the thickness of the polymeric film deposited grows to such an extent that flaking-off of the film occurs when the focus ring 10 is moved up and down with the wafer pedestal 30.

When a mechanical sand-blasting method is used to produce the roughened surface, plastic sands of any mesh size between mesh 200 and mesh 80 may be suitably used. It has been found that with mesh 200 plastic sand, an average radius of the sand particles is about 2 μm, while with the mesh 80 sand, the average radius of the sand particles is about 3.5 μm. The surface roughness of the present invention novel focus ring may also be achieved by a chemical etching method, such as by a strong acid or base.

The present invention novel apparatus and method enable a plasma etching process to be conducted in an etch chamber with substantially reduced particle contamination problem. For instance, it has been found that the chamber particle failure rate can be improved from approximately 20% to less than 5% when the present invention novel focus ring with the roughened surfaces is utilized. Furthermore, the mean time between wet clean (MTBW) for the etch chamber can be prolonged from approximately 1,500 pieces to 2,500 pieces after the roughened focus ring is utilized. The etch chamber available time is thus improved from less than 75% to over 80%.

Figure 1C:
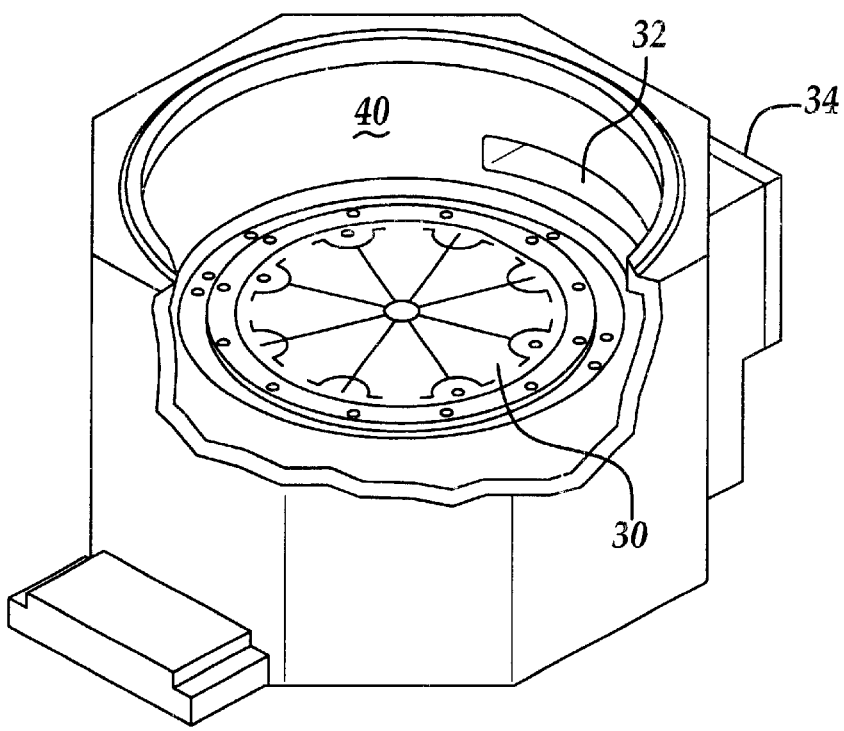
FIG. 1C is a perspective view of the etch chamber showing an electrostatic chuck for holding a wafer thereon.

The present invention novel apparatus and method for reducing particle contamination from a polymeric film in a plasma etcher have therefore been amply described in the above descriptions and in the appended drawings of FIGS. 1A, 1B and 1C.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A dry etching apparatus for a wafer having reduced particle contamination characteristics comprising:

a wafer holder for holding a wafer inside a chamber cavity, and a ring member positioned juxtaposed to said wafer holder, said ring member having surfaces substantially exposed to said chamber cavity, said surfaces being roughened to a depth of between about 1 $\mu$m and about 10 $\mu$m between peaks and valleys formed in said roughened surfaces by sand-blasting with particles of 80 mesh or smaller.

2. A dry etching apparatus for a wafer having reduced particle contamination characteristics according to claim 1, wherein said ring member being made of a high temperature insulative material.

3. A dry etching apparatus for a wafer having reduced particle contamination characteristics according to claim 1, wherein said ring member being made of a ceramic material.

4. A dry etching apparatus for a wafer having reduced particle contamination characteristics according to claim 1, wherein said ring member being made of quartz.

5. A dry etching apparatus for a wafer having reduced particle contamination characteristics according to claim 1, wherein said ring member being a focus ring for a reactive ion etcher.

6. A dry etching apparatus for a wafer having reduced particle contamination characteristics according to claim 1, wherein said roughened surface having a depth between about 3 $\mu$m and about 5 $\mu$m between peaks and valleys formed in said surface.

7. A dry etching apparatus for a wafer having reduced particle contamination characteristics according to claim 1, wherein said roughened surface being formed by sand-blasting with particles between 200 mesh and 80 mesh.

8. A dry etching apparatus for a wafer having reduced particle contamination characteristics according to claim 1, wherein said ring member confines a plasma generated in said chamber cavity onto an exposed surface of said wafer.

9. A dry etching apparatus for etching a wafer comprising:

a wafer holder for holding a wafer inside a chamber cavity, a ring member for positioning juxtaposed to said wafer holder for confining a plasma generated in said chamber cavity onto an exposed surface of said wafer, said ring member being roughened to a depth of between about 1 $\mu$m and about 10 $\mu$m between peaks and valleys formed in said roughened surfaces by sand-blasting with particles between 200 mesh and 80 mesh, and a plasma source for generating a plasma in said chamber cavity.

10. A dry etching apparatus for etching a wafer according to claim 9, wherein said surfaces being roughened to a depth of between about 3 $\mu$m and about 5 $\mu$m between peaks and valleys formed in said roughened surfaces.

11. A dry etching apparatus for etching a wafer according to claim 9, wherein said ring member is a focus ring made of quartz for use in a reactive ion etcher.

* * * * *